United States Patent [19]

Tournereau et al.

[11] Patent Number: 4,807,956
[45] Date of Patent: Feb. 28, 1989

[54] OPTO-ELECTRONIC HEAD FOR THE COUPLING OF A SEMI-CONDUCTOR DEVICE WITH AN OPTIC FIBER, AND A METHOD TO ALIGN THIS SEMI-CONDUCTOR DEVICE WITH THIS FIBER

[75] Inventors: Alain Tournereau, Chalette; Alain Richard, Etrechy; Daniel Dumas; Guy Egea, both of Puisseaux, all of France

[73] Assignee: Thomson Hybrides Et Microondes, Paris, France

[21] Appl. No.: 109,173

[22] Filed: Oct. 16, 1987

[30] Foreign Application Priority Data

Oct. 17, 1986 [FR] France ............................. 86 14421

[51] Int. Cl.4 ................................................ G02B 7/26
[52] U.S. Cl. ................................... 350/96.20; 250/227
[58] Field of Search ............... 350/96.15, 96.20, 30 M; 250/227

[56] References Cited

U.S. PATENT DOCUMENTS 4,623,220 11/1986 Grabbe et al. .................... 350/96.20

FOREIGN PATENT DOCUMENTS 1151277 8/1983 Canada ............................. 350/96.20
2582413 11/1986 France ............................. 350/96.20
2584827 1/1987 France ............................. 350/96.20

Primary Examiner—William L. Sikes
Assistant Examiner—Frank González
Attorney, Agent, or Firm—Oblon, Fisher, Spivak, McClelland & Maier

[57] ABSTRACT

In an opto-electronic head, an optic fiber is coupled with a laser or a light-emitting diode. According to the invention, a plane ceramic substrate acts as a reference plane for the alignment. It is separated into two zones: one zone dedicated to the semi-conductor device and one zone dedicated to the fiber. The second zone supports a heating resistor placed between two insulating layers. A heat barrier, consisting of a slit in the substrate, reduces heat transfers towards the layer to the minimum. To align the two components, a solder preform or polymer preform is put on the resistor. When the preform melts, it forms a drop in which the fiber 4 can be moved in three directions. The invention can be applied to opto-electronic systems.

11 Claims, 2 Drawing Sheets

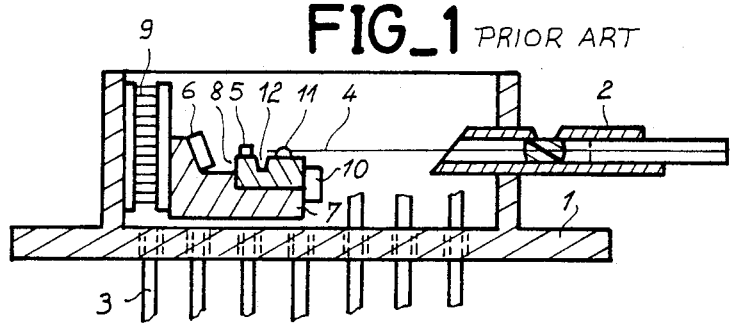
FIG_1 PRIOR ART
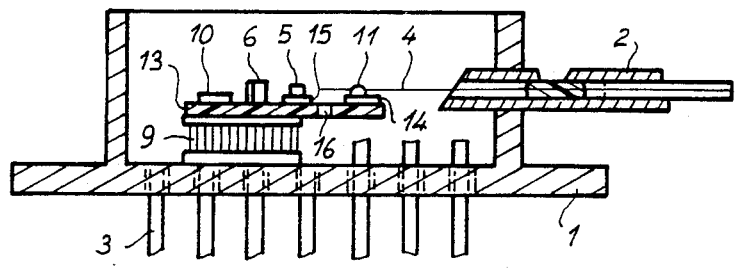
FIG_2
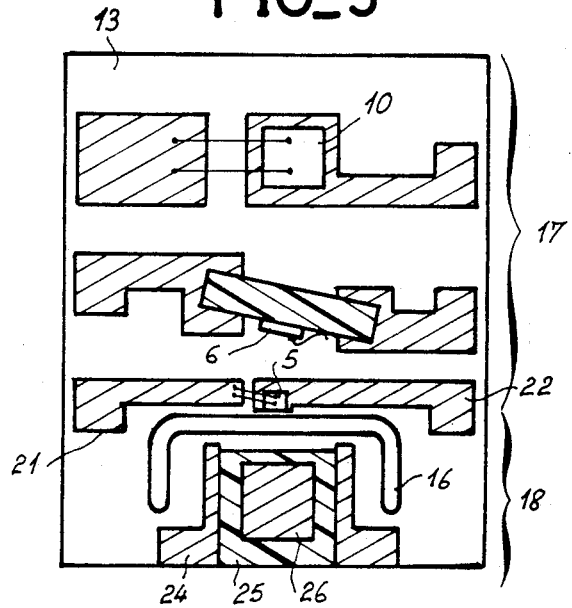
FIG_5

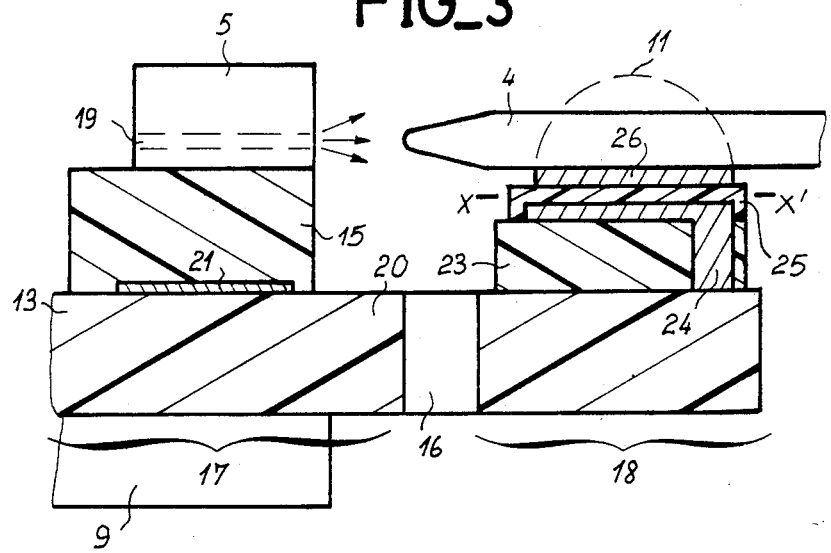
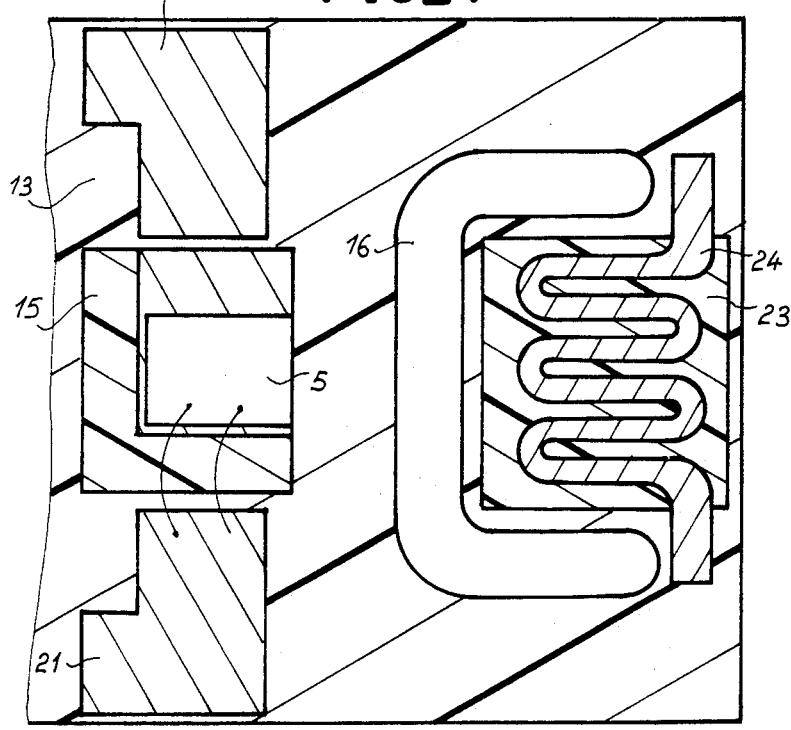

OPTO-ELECTRONIC HEAD FOR THE COUPLING OF A SEMI-CONDUCTOR DEVICE WITH AN OPTIC FIBER, AND A METHOD TO ALIGN THIS SEMI-CONDUCTOR DEVICE WITH THIS FIBER

BACKGROUND OF THE INVENTION

1. Field of the Invention

The present invention pertains to an opto-electronic head in which an optic fiber is coupled to a light emitting or receiving semi-conductor device or to another optic fiber. The invention pertains more es pecially to the means and elements, incorporated into the opto-electronic head, used to align and keep the optic fiber and the semi-conductor device together with high precision. The invention also pertains to a method of alignment along one and the same optical axis.

2. Description of the Prior Art

The coupling of an optic fiber with a light emitting or receiving semi-conductor device is well known: the said coupling is the necessary point of passage in any system using optic fibers. Every optic link requires a transmitter at one of its ends and a receiver at the other, to transform the data signals to be processed from electronic signals into optic signals and vice versa. It is also well-known that, owing to the minute size of the active surfaces of emitting or receiving semi-conductors and of the cores of the optic fibers, the coupling of these components requires precise alignment.

Regardless of the structure of existing opto-electronic heads, this alignment is increasingly being done dynamically (i.e. with the emitter and the receiver in operation, with the receiver analyzing the light transmitted by the optic fiber). The two components are fastened by different means: either with a drop of bonder, polymerized by ultra-violet or thermal radiation, or by metal remelting. Bonding is irreversible whereas solder can be remelted if the alignment has to be re-adjusted. But, in both cases, an external form of energy (heat or light) has to be supplied.

The disadvantage of supplying external energy is that the energy is not sufficiently localized. Thus, certain elements of the opto-electronic head, such as the laser chip, its support and the bonder or solder which fixes the optic fiber, also get heated. Now the materials of which these parts are made have different natures. They have different coefficients of expansion and the optical alignment, when the opto-electronic head is cooled, is no longer the alignment when the head is heated during the adjusting operation. Furthermore, the laser diodes or light-emitting diodes release heat and are cooled during operation by means of a Peltier element, the effect of which is countered by the addition of external energy.

SUMMARY OF THE INVENTION

The opto-electronic head according to the invention removes these disadvantages and makes the optical setting and alignment operations very simple and repeatable. Furthermore, the opto-electronic head can be dismantled, and reversible. The opto-electronic head is formed on a plate of ceramic which acts s its substrate for the mechanical positioning of the components and, at the same time, as a hybrid circuit for the electrical connections. Furthermore, this plate is a reference plane for the optical alignment of the laser and the fiber. A first zone of the substrate is dedicated to the semi-conductor device which may be a laser diode, light-emitting diode or photodiode device as well as to the electrical regulator diode which measures the light emitted by the rear side of the laser, and to the heat regulating thermistor. A second zone of the substrate is dedicated to the fixing of the optic fiber, by means of a soft soldering spot. In this second zone (and of course, in the alignment of the beam emitted by the laser), a small heating resistor has its connection surfaces printed by screen process. The resistor extends between two dielectric layers, with a metallization on top. The thickness of this metallization is such that optical alignment between the laser and the fiber is almost obtained. A soft solder preform, deposited on the upper layer is melted by the heat released by the heating resistor: it suffices to move the fiber in the drop of molten solder to align the fiber with the laser beam, and it suffices to cut off the current flowing through the resistor to fix the position of the fiber. The metal soft solder can be replaced by an organic product such as a polymer which softens under heat. Finally, the zone of the substrate dedicated to the laser and the zone dedicated to the fiber are separated by a heat barrier which extends between them: this barrier is a slit in the ceramic plate, and it reduces the diffusion of heat towards the laser to the minimum.

More precisely, the invention pertains to a head for the coupling of a light emitting or receiving semi-conductor device with an optic fiber, a head wherein its components are assembled on a ceramic substrate forming a reference plane for the optical alignment of the said fiber with the semi-conductor device, and wherein the substrate comprises a first zone dedicated to the semi-conductor device and a second zone dedicated to the optic fiber, the second zone supporting a heating electrical resistor and being separated from the first zone by a heat barrier consisting of a slit in the substrate which partially surrounds the resistor.

BRIEF DESCRIPTION OF THE DRAWINGS

The details and advantages of the invention will be better understood from the following description of an embodiment, made with reference to the appended figures of which:

FIG. 1 is a sectional drawing of the opto-electronic head according to the prior art;

FIG. 2 is a sectional view of an opto-electronic head according to the invention;

FIG. 3 is an enlarged sectional view of the coupling region between the semi-conductor device and the optic fiber according to the invention;

FIG. 4 is a top view corresponding to FIG. 3;

FIG. 5 is a top view of the substrate of the opto-electronic head according to the invention.

DESCRIPTION OF THE PREFERRED EMBODIMENT

For greater clarity and precision, the invention will be explained using an example of a head for the coupling of a laser and an optic fiber but the said invention pertains more generally to the coupling of an opto-electronic semi-conductor device and an optic fiber.

FIG. 1 represents a head where the coupling between a laser and an optic fiber is one of a currently marketed prior art model. Its structure is partly related to present means of optical alignment. The said head is formed inside a metal package 1, fitted with a tube 2, for the passage of the optic fiber, and several access connections 3, some of wich have been drawn. The access connections 3 are either at the bottom of the package, as shown, or on two lateral sides.

The optic fiber 4 is aligned with the laser 5, and a feedback diode 6 measures the light emitted by the rear side of the laser 5. This diode 6 is inclined to avoid light from being reflected towards the laser. All these parts are supported by two metal blocks 7 and 8, which are machined accordingly and fixed to a small Peltier element 9 which draws heat out of the block 7 and restores it to the package 1: this is why the blocks 7 and 8 are so that they jut out and have no contact with the package 1. A thermistor 10 provides heat regulation through the element 9.

To align the fiber 4 with the laser 5, with the said laser 5 in operation, a drop of molten solder 11 is deposited on the fiber 4 and on the corresponding side of the metal block 8. To keep the solder molten, a permanent supply of energy is required during the setting, and this energy heats both the metal block and the laser 5.

Of course, if necessary, the laser 5, the diode 6, the Peltier element 9 and the thermistor 10 can be electrically insulated from each other by dielectric layers on the appropriate sides of the metal blocks 7 and 8.

FIG. 2 shows an opto-electronic head according to the invention. In this figure, the same references have been kept when they identify the same objects.

According to the invention, the constituent elements of an opto-electronic head are integrated into a substrate 13 which is a plane plate made of a ceramic material, such as alumina, fixed to a Peltier element 9 which is itself fixed flat to the bottom of the package 1 of the opto-electronic head. Along its dimension parallel to the axis of the optic fiber, the substrate 13 is greater than the Peltier element 9 so that it has two zones.

The first zone, dedicated to the laser, is perpendicular to the Peltier element 9. It supports the laser 5, the electrical regulator diode 6 and the heat regulating thermistor 10 as well as the screen-process printed conducting tracks providing electrical access to these three components. The regulator diode 6 is fixed vertically to the substrate 13, on a ceramic plate, which is metallized accordingly. The regulator diode 6 is offset laterally to prevent unwanted reflections towards the laser 5. The first zone of te substrate is temperature-regulated.

The second zone of the substrate, dedicated to the optic fiber 4, protrudes over the Peltier element 9, and is not temperature-regulated. It supports a sandwich 14 of layers, which will be described in detail in FIGS. 3 and 4. One of the said layers of the said sandwich is a heating resistive layer. The second zone of the substrate, dedicated to the optic fiber 4, also supports the solder spot 11 which holds the optic fiber 4. The total thickness of the layers 14 is adjusted simultaneously to the thickness of a support 15 beneath the laser so that the optical axis of the laser 5 and the optical axis of the fiber 4 are already, before setting, substantially aligned, i.e. to within 5 or 6 microns (an optical alignment is done at ±1 micron).

When an electrical current flows through the heating resistor, this second zone of the substrate is heated by conduction since it is not regulated by the Peltier element 9: a heat barrier 16, consisting of a slit made in the thickness of the substrate 13, deflects the flow of heat coming from the heating resistor towards the laser 5, and reduces the flow of heat to the minimum.

FIGS. 3 and 4, which are enlargements of the fiber-laser coupling region, gives a better view of the structure according of the structure according to the invention. The straight part of the FIG. 4 is cut at the plane XX' of FIG. 3 so as to show the heating resistor.

The ceramic substrate 13 thus comprises a zone 17, which is temperature-regulated and dedicated to the laser 5, and a non-regulated zone 18 dedicated to the fiber 4, these two zones being delimited by a slit 16 in the substrate 13.

In the first zone 17, the laser 5 is fixed to a base 15 which may be formed by the screen-process printing of dielectric and conductive layers. The emitting cavity 19 of the laser 5 has been shown in dashes: this emitting cavity is near one of the main sides of the laser 5 chip. Screen process printing and the manufacture of lasers are techniques over which there is sufficient mastery so that the distance between the emitting cavity 19 of the reference plane 20, formed by the upper side of the substrate, to be known to within ±5 microns. It is also possible to deposit the laser contact metallizations 21 and 22, with at least one of these metallizations, namely 22, crossing the step formed by the layer of the base 15.

The sandwich of screen-process printed layers 14 is deposited in the second zone 18, and on an appropriate axis. This sandwich consists of:

one intermediate insulating layer 23 made of dielectric material. This layer has a dual purpose: to insulate the substrate 13 thermally when the resistor is heated, and to partly compensate for the thickness of the base 15 of the laser 5;

an electrical resistor 24 with its connection surfaces which descend on the substrate 13. This resistor has a value of about 10 ohms ±25%, and obviously depends on the voltage with which it is supplied;

an insulating layer 25 which imperviously covers the entire resistor 24. The purpose of this layer 25, made of dielectric material, is to prevent the solder preform, which will subsequently be deposited on the sandwich 4 to fix the fiber 4, from short-circuiting the resistor 24;

a metallic layer 26 which enables the solder 11 to wet the surface to which it adheres, and to delimit this surface. The layer 26 also transmits the heat released by the heating resistor to the solder.

The thickness of the insulating layer 23 is such that the total thickness of the sandwich 14 enables the optic fiber, before setting itself, to be approximately aligned with the emitting cavity 19 of the laser, to within ±5 microns.

The heat barrier between the two zones 17 and 18 of the substrate 13 is formed by a slit 16, drilled with a power laser throughout the thickness of the substrate. This slit 16 may have a different shape from the one shown, but it must meet two requirements:

it should not destroy the monolithic nature of the substrate 13 which, thus, stays in one piece and forms the reference plane for the laser-fiber alignment. Despite the slit 16, the substrate remains monolithic: the slit therefore does not reach the edges of the substrate;

as regards heat dissipation towards the substrate, the slit is advantageously made as close as possible to the sandwich 14, which it partially surrounds. However, it should be as close as possible to the sandwich 14 without damaging the solidity of the substrate, on three sides.

FIG. 5 shows a top view of the substrate 13 which supports the various components described, to make an opto-electronic head, the said substrate having a heating resistor 24 and a heat barrier slit 16.

The alignment method according to the invention is very simple. A round or square-shaped solder preform is deposited on the conducting layer 26, and the optic fiber 4 is laid on the preform. The optoelectronic head is then made to function and, at the same time, a current (some 25 mA at 5V) is sent through the heating resistor 24. The solder preform melts and takes a hemispherical shape, an the optic fiber can penetrate this mass of molten solder.

A micro-handling device is used to move the optic fiber in three spatial dimensions until the optimum alignment is attained. It then suffices to cut off the electrical power to the heating resistor 24 and the drop of solder 11 sets within a few seconds.

The method can be used to redo this alignment by again melting the solder if, during the cooling process, the alignment has been slightly modified by the tolerance of the expansion coefficients of the opto-electronic head components.

Better results are obtained if the optic fiber is previously metallized on its part which crosses the drop of solder.

According to the invention, the means used to fix the optic fiber may also be, instead of metal solder, a small volume of an organic product such as a polymer or a drop of bonder, which is solid when cold, but can melt under heat.

The fiber is the immobilized in the tube 2 of the package 1 by its plastic sheath and by means of a drop of bonder or solder, and the package is closed with a lid.

Of course, the opto-electronic head and the method according to the invention can be applied to any device combining a light emitting or receiving semi-conductor with an optic fiber.

What is claimed is:

1. A head for the coupling of a light emitting or receiving semi-conductor device with an optic fiber, wherein said head comprises components assembled on a monolithic ceramic substrate forming a reference plane for the optical alignment of the said fiber with the semi-conductor device, and wherein the substrate comprises a first zone dedicated to the semi-conductor device and a second zone dedicated to the optic fiber, the second zone supporting a heating electrical resistor deposited on the ceramic substrate and being separated from the first zone by a heat barrier consisting of a slit in the substrate which partially surrounds the resistor.

2. An opto-electronic head according to the claim 1 wherein the light-emitting semi-conductor device is a laser.

3. An opto-electronic head according to the claim 1 wherein the light emitting or receiving semi-conductor device is a light-emitting diode.

4. An opto-electronic head according to the claim 1 wherein the electrical heating resistor is a screen-process printed resistor between a first screen-process printed insulating layer, made of dielectric material deposited on the second zone of the substrate, and a second screen-process printed insulating layer, made of dielectric material, which is itself lined by a metal screen-process printed conducting layer.

5. An opto-electronic head according to the claim 4, wherein all the screen-process printed layers are positioned on the substrate at the place where the optic fiber should be fixed by a soldering spot.

6. An opto-electronic head according to the claim 4 wherein, with the semi-conductor device fixed on a base, the thicknesses of the screen-process printed layers on the second zone of the substrate and the thickness of the base on the first zone of the substrate are adjusted so that the optical axes of the semi-conductor device and of the optic fiber are aligned, before setting, to within 5 microns.

7. An opto-electronic head according to the claim 1 wherein, in order to limit heat transfer by the substrate, the slit which crosses the substrate throughout its thickness is made as close as possible to the heating resistor.

8. An opto-electronic head according to the claim 7 wherein the heat barrier slit has a shape surrounding the heating resistor but reaches no side of the substrate, preserving the rigidity of the latter as a reference plane.

9. A method for the alignment of an optic fiber with a light emitting or receiving semi-conductor deivce in an opto-electronic head, wherein said head includes components assembled on a ceramic substrate forming a reference plane for the optical alignment of the said fiber with the semi-conductor device, and wherein the substrate comprises a first zone dedicated to the semi-conductor device and a second zone dedicated to the optic fiber, the second zone supporting a heating electrical resistor and being separated from the first zone by a heat barrier consisting of a slit in the substrate which partially surrounds the resistor, the said alignment being done by dynamic setting with the said opto-electronic head in operation, said method comprising the following sequence of operations:

depositing a small volume of a meltable fastening means on a conducting layer which is above the heating resistor, depositing an optic fiber on the fastening means, applying an electric current to the heating resistor, so that the fastening means, in melting, takes the form of a drop into which the fiber penetrates, aligning the fiber by micro-handling, when the optical alignment is obtained, cutting-off the current flowing through the heating resistor so that the fiber is immobilized through the cooling of the fastening means.

10. Alignment method according to the claim 9, wherein the fastening means comprise a metal solder alloy.

11. Alignment method according to the claim 9, wherein the fastening means comprise an organic polymer which is solid when closed and can melt under heat.

* * * * *